(12) United States Patent
Li et al.

(10) Patent No.: US 11,437,986 B2
(45) Date of Patent: Sep. 6, 2022

(54) GATE VOLTAGE MAGNITUDE COMPENSATION EQUALIZATION METHOD AND CIRCUIT FOR SERIES OPERATION OF POWER SWITCH TRANSISTORS

(71) Applicant: Zhejiang University, Hangzhou (CN)

(72) Inventors: Wuhua Li, Hangzhou (CN); Chengmin Li, Hangzhou (CN); Saizhen Chen, Hangzhou (CN); Haoze Luo, Hangzhou (CN); Xin Xiang, Hangzhou (CN); Chushan Li, Hangzhou (CN); Xiangning He, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 17/285,914

(22) PCT Filed: Jun. 1, 2020

(86) PCT No.: PCT/CN2020/093790
§ 371 (c)(1),
(2) Date: Apr. 16, 2021

(87) PCT Pub. No.: WO2021/128734
PCT Pub. Date: Jul. 1, 2021

(65) Prior Publication Data
US 2021/0399724 A1 Dec. 23, 2021

(30) Foreign Application Priority Data
Dec. 24, 2019 (CN) .......................... 201911347481.2

(51) Int. Cl.
*H03K 17/042* (2006.01)
*H03K 17/14* (2006.01)
*H03K 19/003* (2006.01)

(52) U.S. Cl.
CPC ..... *H03K 17/04206* (2013.01); *H03K 17/145* (2013.01); *H03K 19/00369* (2013.01)

(58) Field of Classification Search
CPC combination set(s) only.
See application file for complete search history.

(56) References Cited

U.S. PATENT DOCUMENTS

| | | | |
|---|---|---|---|
| 8,836,311 B2 * | 9/2014 | Tai | H03K 17/168 323/289 |
| 2020/0244265 A1 * | 7/2020 | Paganini | H03K 19/00369 |

\* cited by examiner

*Primary Examiner* — Long Nguyen
(74) *Attorney, Agent, or Firm* — Muncy, Geissler, Olds & Lowe, P.C.

(57) ABSTRACT

A gate voltage magnitude compensation equalization method and circuit for series operation of power switch transistors are provided. A dynamic voltage equalization of series-connected power switch transistors is implemented by using sampling principles where voltages of the power switch transistors are controlled by gate voltage magnitude and unbalanced voltage differentials are converted into unbalanced current differentials of buffer currents. The gate voltage magnitude compensation equalization method and circuit relates to differential control and works in a dynamic voltage change process of the series-connected power switch transistors, without having a negative effect on operation of the power switch transistors under normal operating conditions. Only adopting passive devices, the gate voltage magnitude compensation equalization circuit has a simple structure, is easy to integrate on a device drive board, implements response tracking of unbalanced voltage and voltage equalization of the series-connected power switch transistors, and improve speedability and stability of voltage equalization control.

7 Claims, 5 Drawing Sheets

GATE VOLTAGE MAGNITUDE COMPENSATION EQUALIZATION METHOD AND CIRCUIT FOR SERIES OPERATION OF POWER SWITCH TRANSISTORS

CROSS REFERENCE TO THE RELATED APPLICATIONS

This application is the national stage entry of International Application No. PCT/CN2020/093790, filed on Jun. 1, 2020, which is based upon and claims priority to Chinese Patent Application No. 201911347481.2 filed on Dec. 24, 2019, the entire contents of which are incorporated herein by reference.

TECHNICAL FIELD

The present disclosure relates to the field of power electronic technologies, and more particularly, to a gate voltage magnitude compensation equalization method and circuit for series operation of power switch transistors.

BACKGROUND

As for power electronic equipment, medium-voltage high-power conversion equipment usually refers to electrical energy conversion equipment with a voltage level of 1 kV-35 kV and a power level of hundreds of kilowatts or more. Mainstream power switch transistors are silicon-based insulation gate bipolar transistors (IGBTs), and commercial silicon-based IGBTs have a maximum voltage level of 6.5 kV. The next-generation power switch transistors are SiC metal-oxide-semiconductor field-effect transistors (SiC MOSFETs), and the current commercially used SiC MOSFETs have a maximum voltage level of 1.7 kV. Due to the limited voltage withstand capability of a single power switch transistor, in high-power applications, a plurality of series-connected power switch transistors are usually employed to achieve medium-voltage applications. In order to achieve the reliable series connection of multiple power switch transistors, it is first necessary to ensure the voltage equalization of the series-connected power switch transistors.

The main reasons causing the voltage imbalance of the series-connected power switch transistors include: 1) parameter differences between the power switch transistors, mainly including differences between gate threshold voltages, differences between junction capacitance and transconductance, etc.; 2) external circuit parameter differences, mainly including snubber circuit parameter differences and drive parameter differences, where the snubber circuit parameter differences mainly include snubber resistance differences and snubber capacitance differences, and the drive parameter differences mainly include drive signal delay differences, drive voltage differences, and drive resistance differences, etc.

At present, there are three methods for voltage equalization of series-connected power switch transistors as follows. 1) A passive snubber circuit, wherein a circuit composed of a capacitor, a resistor, a semiconductor diode, or a combination thereof is connected in parallel at two ends of each power switch transistor in series connection, thereby improving voltage and current characteristics of the power switch transistors in a dynamic process so as to achieve the objective of balancing the voltage. This circuit is simple for implementation and can achieve a coarse adjustment of unbalanced voltage. 2) A gate signal delay voltage equalization method, which implements the voltage equalization by controlling drive signal switch edge delay. This method has a better effect, but needs to introduce a drain-source voltage sampling circuit and a drive delay adjustment circuit. Therefore, this method is higher in costs and is complicated in control. 3) A gate voltage magnitude compensation method, wherein an unbalanced voltage is fed back to a gate drive signal by a feedback loop, and a gate voltage magnitude is adjusted to achieve the voltage equalization. This method has a better effect, but needs to introduce an unbalanced voltage differential sampling circuit and a power switch transistor gate voltage magnitude compensation circuit.

Among the above three methods for voltage equalization of series-connected power switch transistors, the gate voltage magnitude compensation method has the best effect, followed by the gate signal delay voltage equalization method, and the passive snubber circuit has a limited effect. The traditional gate voltage magnitude compensation method uses an active circuit composed of a triode and an operational amplifier or the like to achieve voltage feedback and magnitude compensation. However, this method is slow in closed-loop response speed, and thus is not suitable for high switching frequency applications. Furthermore, the circuit structure is complex and the reliability is poor.

SUMMARY

To overcome defects of the existing technologies, the present disclosure provides a gate voltage magnitude compensation equalization method and circuit for series operation of power switch transistors.

In one aspect, the present disclosure provides a gate voltage magnitude compensation equalization circuit for series operation of power switch transistors, including N power switch transistors, N sampling units, N gate voltage magnitude compensation units, and N gate drive circuits in series operation, wherein the N is a natural number greater than or equal to 2. Each of the power switch transistors is connected in parallel with a resistor-capacitor snubber circuit, and each of the power switch transistors corresponds to one sampling unit, one gate voltage magnitude compensation unit, and one gate drive circuit. Each of the sampling units samples current values of all the resistor-capacitor snubber circuits. Each of the gate voltage magnitude compensation units is connected to a corresponding sampling unit and obtains a sampling signal outputted by the corresponding sampling unit so as to obtain a current signal in direct proportion to a variation rate of an unbalanced voltage differential of a corresponding power switch transistor and outputs the current signal to a corresponding gate drive circuit. Each of the gate drive circuits adds a compensation voltage into a gate voltage of the corresponding power switch transistor and outputs the voltage, which is obtained by adding the compensation voltage into the gate voltage, to the corresponding power switch transistor.

In one embodiment of the present disclosure, each of the gate drive circuits includes a drive voltage source and two gate drive resistors connected in series. Two ends of either one of the gate drive resistors are connected in parallel with the current signal introduced by the gate voltage magnitude compensation unit, and the drive compensation voltage in direct proportion to the unbalanced voltage differential is added into the gate voltage of the power switch transistor.

In one embodiment of the present disclosure, each of the sampling units includes N sampling inductors wound round a same magnetic ring, and a first sampling inductor of the N sampling inductors samples the current value of the resistor-capacitor snubber circuit connected in parallel with the corresponding power switch transistor, and the remaining sampling inductors of the N sampling inductors sample the current values of the resistor-capacitor snubber circuits connected in parallel with the remaining power switch transistors, respectively. The first sampling inductor is opposite to the remaining sampling inductors in coil winding direction, and the number of turns of the first sampling inductor is N−1 times the number of turns of the remaining sampling inductors, wherein the N is a natural number greater than or equal to 2.

In one embodiment of the present disclosure, each of the gate voltage magnitude compensation units includes a drive voltage compensation inductor wound round the same magnetic ring, and a coil winding direction of the drive voltage compensation inductor is the same as that of the first sampling inductor. The drive voltage compensation inductor, the first sampling inductor and the remaining sampling inductors are wound round the same magnetic ring to form a coupling transformer. The drive voltage compensation inductor is connected in parallel to two ends of a gate drive resistor of the corresponding gate drive circuit.

In one embodiment of the present disclosure, the power switch transistors adopt insulation gate bipolar transistor (IGBT) modules, and an emitter of a $(k-1)^{th}$ IGBT is connected to a collector of a $k^{th}$ IGBT, wherein the k is a natural number and $2 \le k \le N$.

In one embodiment of the present disclosure, the power switch transistors adopt SiC metal-oxide-semiconductor field-effect transistor (MOSFET) modules, and a source of a $(k-1)^{th}$ SiC MOSFET is connected to a drain of a $k^{th}$ SiC MOSFET, wherein the k is a natural number and $2 \le k \le N$.

In one embodiment of the present disclosure, every two adjacent resistor-capacitor snubber circuits are in an overlapped layout, such that electric currents flowing through snubber capacitors of the two adjacent resistor-capacitor snubber circuits are opposite in direction.

In another aspect, the present disclosure also provides a gate voltage magnitude compensation equalization method for series operation of power switch transistors, which includes the following steps. Each of power switch transistors corresponds to one sampling unit, one gate voltage magnitude compensation unit, and one gate drive circuit, and they all are connected in series for operation, and each of the power switch transistors is connected in parallel with a resistor-capacitor snubber circuit. N power switch transistors, N sampling units, N gate voltage magnitude compensation units, and N gate drive circuits are connected in series for operation in total, wherein the N is a natural number greater than or equal to 2. Each resistor-capacitor snubber circuit converts a voltage signal obtained in a dynamic switch process of a corresponding power switch transistor connected in parallel with the resistor-capacitor snubber circuit into a current signal. Each of the sampling units samples current values of all the resistor-capacitor snubber circuits. Each of the gate voltage magnitude compensation units obtains a sampling signal outputted by a corresponding sampling unit to obtain a current signal in direct proportion to a variation rate of an unbalanced voltage differential of the corresponding power switch transistor, and outputs the current signal to a corresponding gate drive circuit. Each of the gate drive circuits adds a compensation voltage into a gate voltage of the corresponding power switch transistor, and outputs the voltage obtained by adding the compensation voltage into the gate voltage to the corresponding power switch transistor, such that real-time compensation of an unbalance voltage is implemented.

In one embodiment of the present disclosure, in the step where each of the gate voltage magnitude compensation units obtains the current signal in direct proportion to the variation rate of the unbalanced voltage differential of the corresponding power switch transistor, each of the gate voltage magnitude compensation units obtains the current signal in direct proportion to the variation rate of the unbalanced voltage differential of the power switch transistor by subtracting an average value of the currents of the remaining resistor-capacitor snubber circuits from the value of the current of the resistor-capacitor snubber circuit connected in parallel with the corresponding power switch transistor.

Compared with the existing technical solutions, the present disclosure has the following beneficial effects.

In the present disclosure, the dynamic voltage equalization of series-connected power switch transistors is implemented by using sampling principles where voltages of the power switch transistors are controlled by gate voltage magnitude and the unbalanced voltage differentials are converted into unbalanced current differentials of buffer currents. The gate voltage magnitude compensation equalization method and circuit for the series operation of the power switch transistors provided by the present disclosure relates to differential control. That is, they only work when a device has voltage imbalance. Furthermore, when the series-connected power switch transistors reach a steady voltage, the gate voltage magnitude compensation units have no compensation voltage output. That is, the circuit only works in the voltage dynamic change process of the series-connected power switch transistors, without having a negative effect on operation of the power switch transistors under normal operating conditions. Only adopting passive devices, the present disclosure has a simple structure, is easy to integrate on a device drive board, can implement quick response tracking of unbalanced voltage and voltage equalization of series-connected power switch transistors, and improve speedability and stability of voltage equalization control.

DETAILED DESCRIPTION OF THE EMBODIMENTS

To more specifically describe the present disclosure, the technical solutions of the present disclosure are described in detail below with reference to the accompanying drawings and the specific embodiments.

Figure 1:
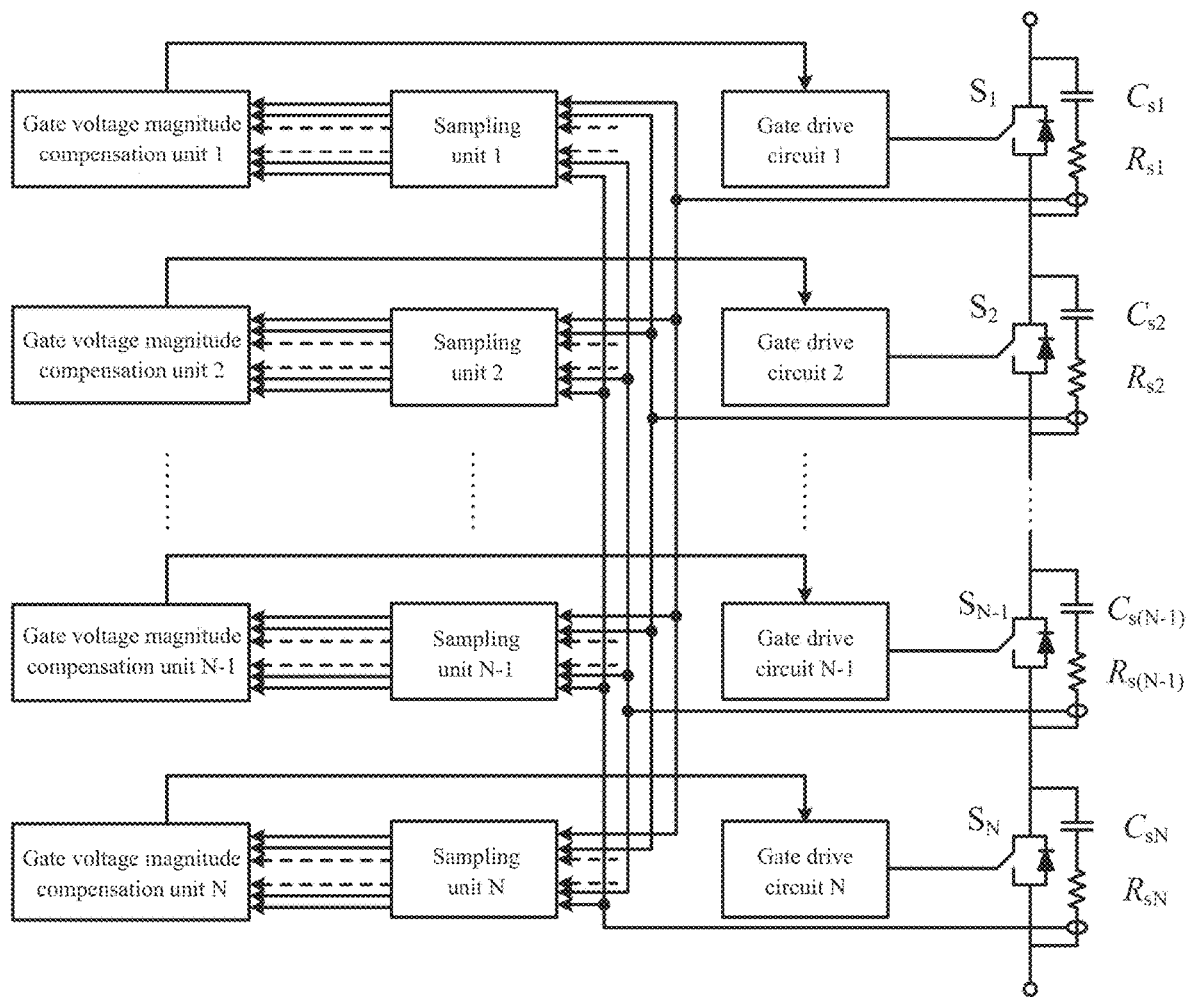
FIG. 1 is a schematic diagram showing a voltage equalization circuit implementing series operation of a plurality of power switch transistors according to the present disclosure.
Figure 2:
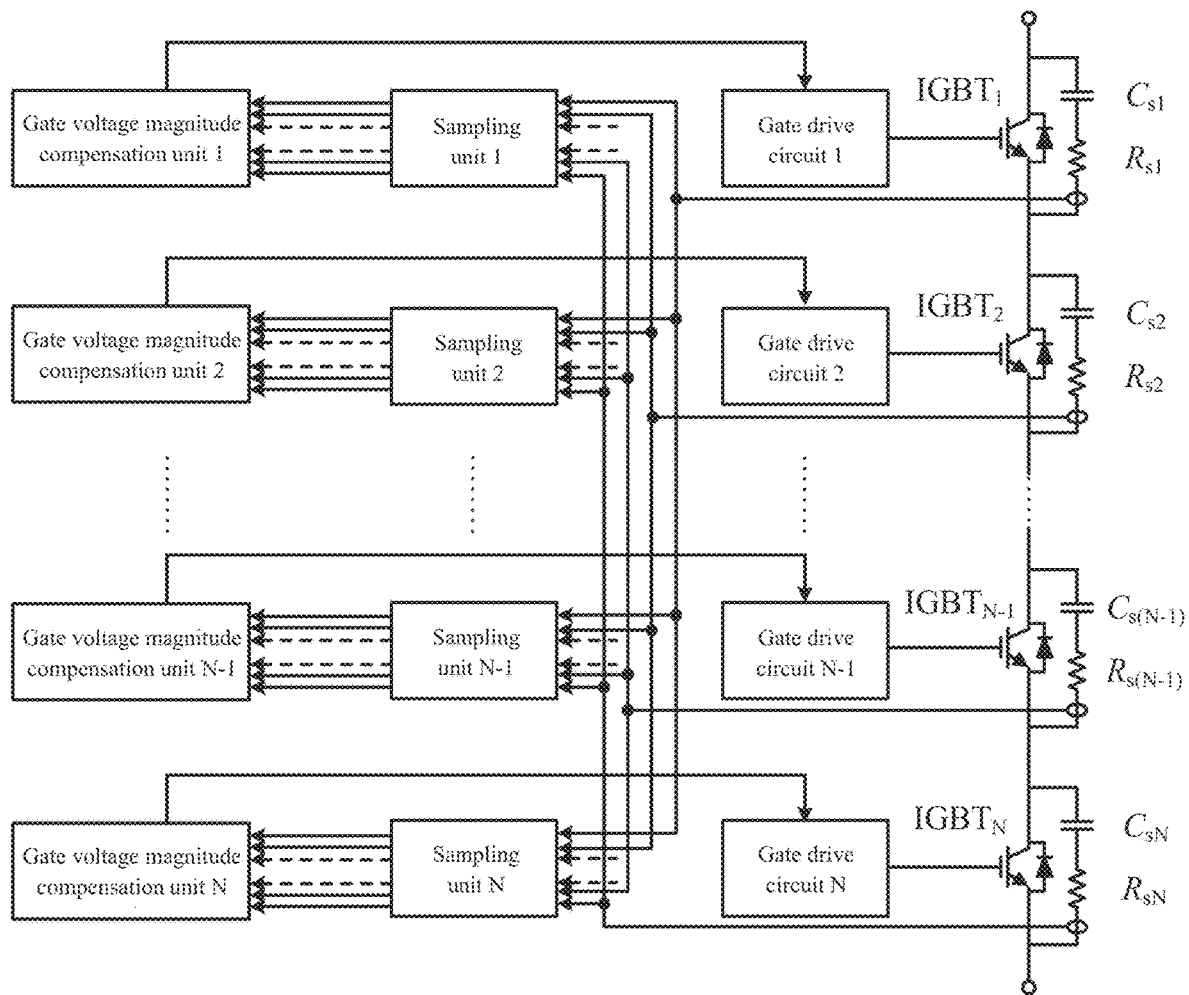
FIG. 2 is a schematic diagram showing a voltage equalization circuit implementing series operation of a plurality of IGBTs according to an embodiment of the present disclosure.
Figure 3:
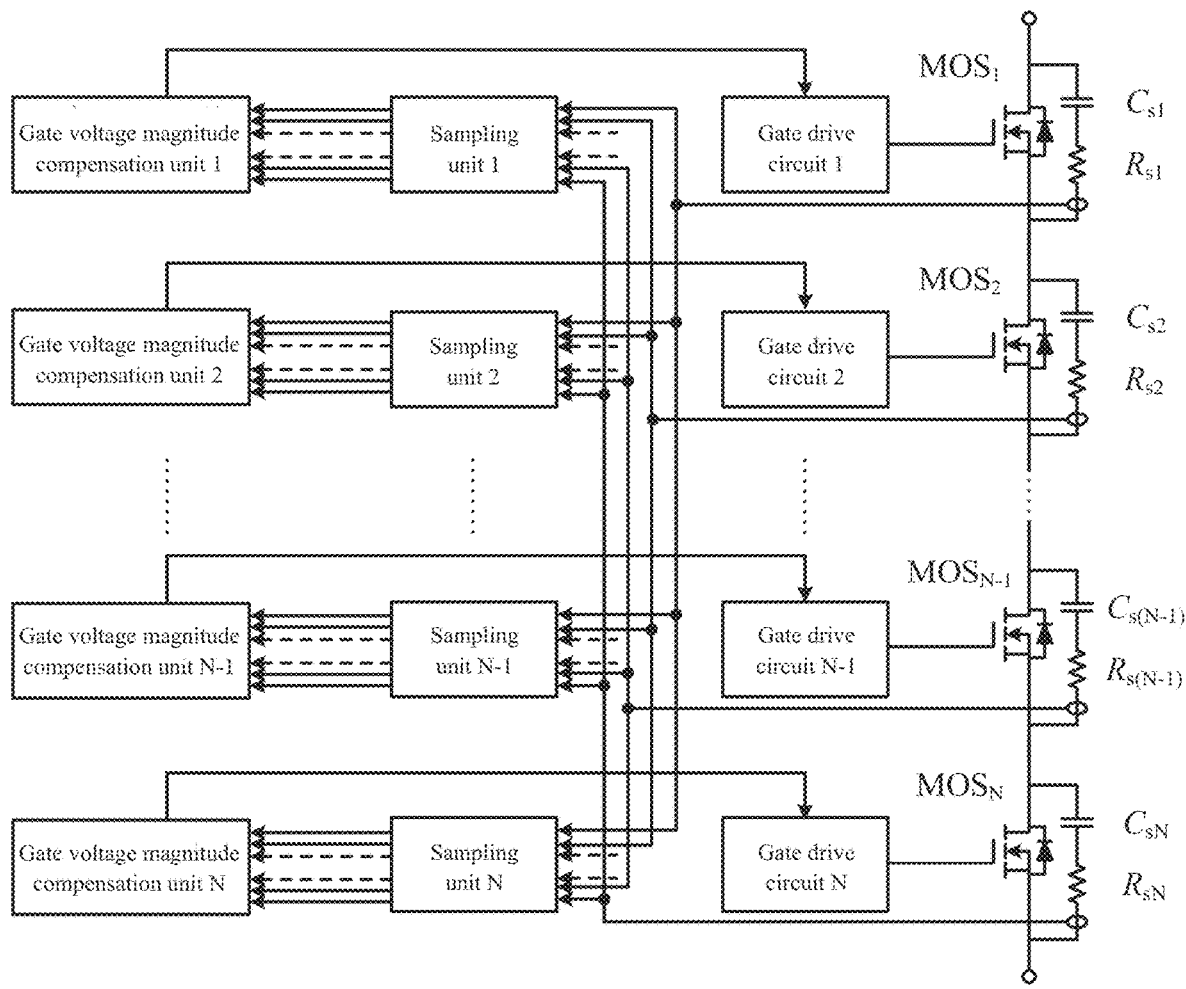
FIG. 3 is a schematic diagram showing a voltage equalization circuit implementing series operation of a plurality of SiC MOSFETs according to another embodiment of the present disclosure.

The present disclosure relates to a gate voltage magnitude compensation equalization circuit for series operation of power switch transistors, and the schematic diagram of this circuit is shown in FIG. 1. $S_1, S_2, \ldots, S_{N-1}$, and $S_N$ in FIG. 1 represent power switch transistors. The gate voltage magnitude compensation equalization circuit for the series operation of the power switch transistors includes; N power switch transistors, N sampling units, N gate voltage magnitude compensation units, and N gate drive circuits, which are all in series operation, wherein the number N is a natural number greater than or equal to 2. Each of the power switch transistors is connected in parallel with a resistor-capacitor (RC) snubber circuit, and each of the power switch transistors corresponds to one sampling unit, one gate voltage magnitude compensation unit, and one gate drive circuit. Each of the sampling units samples current values of all the resistor-capacitor snubber circuits. Each of the gate voltage magnitude compensation units is connected to a corresponding sampling unit and obtains a sampling signal outputted by the corresponding sampling unit to obtain a current signal in direct proportion to a variation rate of an unbalanced voltage differential of a corresponding power switch transistor, and outputs the current signal to a gate drive circuit corresponding to the gate voltage magnitude compensation unit. Each of the gate drive circuits adds a compensation voltage into a gate voltage of the corresponding power switch transistor, and outputs the voltage obtained by adding the compensation voltage into the gate voltage to the corresponding power switch transistor.

Where the power switch transistors are insulation gate bipolar transistors (IGBTs), a schematic diagram showing a voltage equalization circuit implementing the series operation of a plurality of IGBTs is shown in FIG. 2. $IGBT_1$, $IGBT_2, \ldots, IGBT_{N-1}$, and $IGBT_N$ in FIG. 2 represent insulation gate bipolar transistors. Where the power switch transistors are SiC metal-oxide semiconductor field-effect transistors (SiC MOSFETs), a schematic diagram showing a voltage equalization circuit implementing the series operation of a plurality of SiC MOSFETs is shown in FIG. 3. $MOS_1, MOS_2, \ldots, MOS_{N-1}$, and $MOS_N$ in FIG. 3 represent SiC metal-oxide semiconductor field-effect transistors.

Figure 4:
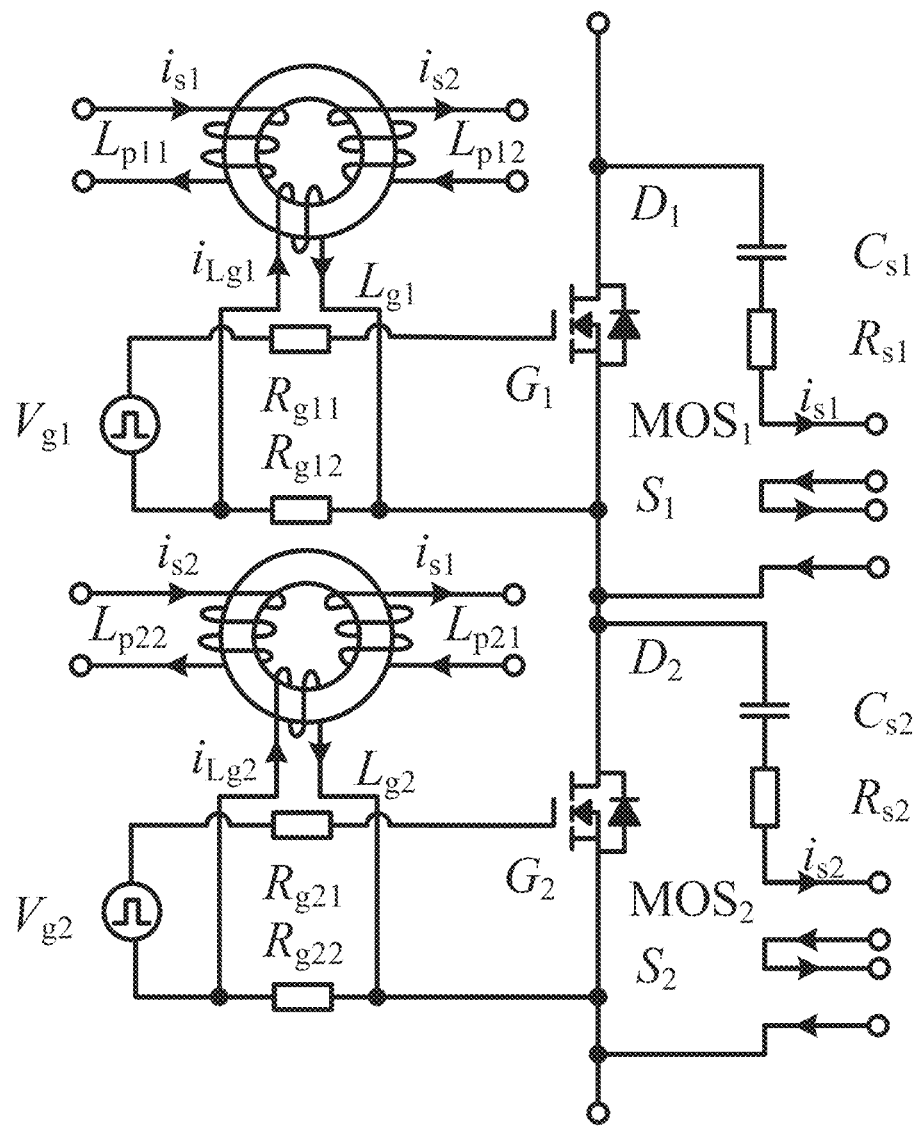
FIG. 4 is a schematic diagram showing a voltage equalization circuit implementing series operation of two SiC MOSFETs according to another embodiment of the present disclosure.

A schematic diagram showing a voltage equalization circuit implementing the series operation of two power switch transistors $S_1$ and $S_2$ according to an embodiment of the present disclosure is shown in FIG. 4. The gate voltage magnitude compensation equalization circuit for the series operation of the power switch transistors in this embodiment includes two series-connected SiC MOSFETs, and each of the SIC MOSFETs is connected in parallel with an RC snubber circuit. In this embodiment, a snubber resistor $R_{s1}$ and a snubber capacitor $C_{s1}$ form a first snubber circuit, and a snubber resistor $R_{s2}$ and a snubber capacitor $C_{s2}$ form a second snubber circuit, i.e., the remaining snubber circuit(s). The first SIC MOSFET (i.e., $MOS_1$) is connected in parallel with the first snubber circuit, and the second SiC MOSFET (i.e., $MOS_2$) is connected in parallel with the second snubber circuit.

In this embodiment, each of the sampling units includes two sampling inductors wound round the same magnetic ring, and the number of the sampling inductors is the same as that of the power switch transistors. A sampling inductor $L_{p11}$ and a sampling inductor $L_{p12}$ constitute a first sampling unit, and a sampling inductor $L_{p21}$ and a sampling inductor $L_{p22}$ constitute a second sampling unit. In the first sampling unit, $L_{p11}$ represents the first sampling inductor, and $L_{p12}$ represents the second sampling inductor, i.e., the remaining sampling inductor(s). In the second sampling unit, $L_{p21}$ represents the first sampling inductor, and $L_{p22}$ represents the second sampling inductor, i.e., the remaining sampling inductor(s). The sampling inductor $L_{p11}$ and the sampling inductor $L_{p21}$ are connected in series into the first RC snubber circuit to sample the buffer current of the first snubber circuit. That is, the first SiC MOSFET is sampled, i.e., a variation rate of a dynamic switching voltage of the $MOS_1$. The sampling inductor $L_{p12}$ and the sampling inductor $L_{p22}$ are connected in series into the second snubber circuit to sample the buffer current of the second snubber circuit. That is, the second SiC MOSFET is sampled, i.e., a variation rate of a dynamic switching voltage of the $MOS_2$. The number of turns of the first sampling inductor of the sampling unit is N−1=2−1=1 time that of the remaining sampling inductor(s) (where N represents the number of the power switch transistors). That is, the number of turns of the two sampling inductors is the same, which is equal to $N_1$.

In this embodiment, each of the gate voltage magnitude compensation units includes a drive voltage compensation inductor. In the first gate voltage magnitude compensation unit, the drive voltage compensation inductor $L_{g1}$, the sampling inductor $L_{p11}$, and the sampling inductor $L_{p12}$ are wound round the same magnetic ring to form a coupling transformer. In the second gate voltage magnitude compensation unit, the drive voltage compensation inductor $L_{g2}$, the sampling inductor $L_{p21}$, and the sampling inductor $L_{p22}$ are wound round another magnetic ring to form a coupling transformer. In the first gate voltage magnitude compensation unit, a coil winding direction of the drive voltage compensation inductor $L_{g1}$ is the same as that of the sampling inductor $L_{p11}$ but is opposite to that of the sampling inductor $L_{p12}$. In the second gate voltage magnitude compensation unit, the coil winding direction of the drive voltage compensation inductor $L_{g2}$ is the same as that of the sampling inductor $L_{p22}$ but is opposite to that of the sampling inductor $L_{p21}$. The number of turns of the drive voltage compensation inductor $L_{g1}$ is the same as that of the drive voltage compensation inductor $L_{g2}$, which is equal to $N_2$. In this embodiment, the drive voltage compensation inductor and the two sampling inductors are wound round the same magnetic ring, such that components can be saved and costs can be reduced, but the present disclosure is not limited thereto. In other embodiments, the sampling inductors may separately sample by winding coils round another magnetic ring.

When the voltages of the two series-connected SiC MOSFETs change dynamically, the buffer current differential between the two RC snubber circuits is fed back to the gate voltage magnitude compensation units through the sampling inductors, and the drive voltage compensation inductors induce the induced currents in direction proportion to the current differential between the snubber circuits. The currents $i_{Lg1}$ and $i_{Lg2}$ flowing through the two drive voltage compensation inductors are separately as follows:

$$\begin{cases} i_{Lg1} = -\dfrac{N_1}{N_2} \cdot (i_{S1} - i_{S2}) \\ i_{Lg2} = -\dfrac{N_1}{N_2} \cdot (i_{S2} - i_{S1}) \end{cases}$$

In this embodiment, each of the gate drive circuits includes a drive voltage source and two gate drive resistors connected in series. The first gate drive circuit includes a drive voltage source $V_{g1}$ and gate drive resistors $R_{g11}$ and $R_{g12}$. The second gate drive circuit includes a drive voltage source $V_{g2}$ and gate drive resistors $R_{g21}$ and $R_{g22}$. Two ends of the gate drive resistors $R_{g12}$ and $R_{g22}$ are respectively connected in parallel with the corresponding coupling transformers to introduce feedback signals, such that drive compensation voltages in direct proportion to the unbalanced voltage differential can be added into the gate voltages of the power switch transistors. In an embodiment, the drive voltage compensation inductor may be equivalent to a controlled current source, and the drive voltage compensation inductor $L_{g1}$ is connected in parallel to the two ends of the drive resistor $R_{g12}$ to generate a compensation voltage $V_{com1}$. The drive voltage compensation inductor $L_{g2}$ is connected in parallel to the two ends of the drive resistor $R_{g22}$ to generate a compensation voltage $V_{com2}$. The compensation voltage $V_{com1}$ and the compensation voltage $V_{com2}$ are respectively as follows:

$$\begin{cases} v_{com1} = -i_{Lg1} R_{g2} = \dfrac{N_1}{N_2} R_{g12} \cdot (i_{S1} - i_{S2}) \\ v_{com2} = -i_{Lg2} R_{g2} = \dfrac{N_1}{N_2} R_{g22} \cdot (i_{S2} - i_{S1}) \end{cases}$$

The buffer current differentials of the snubber circuits reflects differentials among variation rates of the unbalanced voltage differentials in the dynamic process of a plurality of SiC MOSFET devices connected in series. Unbalanced voltage closed-loop control is implemented by compensating the differentials among the variation rates of the unbalanced voltage differentials to the gate drive signal of each SiC MOSFET through the drive voltage compensation inductors, such that voltage equalization is implemented.

The snubber circuit at the power-side of the circuit is connected in series with the coupling transformer, which may increase the parasitic inductance of the snubber circuit and have a negative effect on absorption characteristics of the snubber circuit. At the gate-side of the circuit, the coupling transformer output may be equivalent to a controlled current source, and thus the parasitic impedance of the loop only has a limited effect on the gate. Therefore, in order to reduce effects of non-ideal parameters, it is necessary to focus on reducing the parasitic inductance of the loop at the power-side. For the RC snubber circuit, an external current may charge or discharge a snubber capacitor when a device is turned on or off. The parasitic inductance existing in the actual RC circuit may hinder the variation of a charging current and partially offset the voltage equalization effect of the snubber circuit. Therefore, the parasitic inductance of the buffer circuit needs to be as small as possible.

Figure 5:
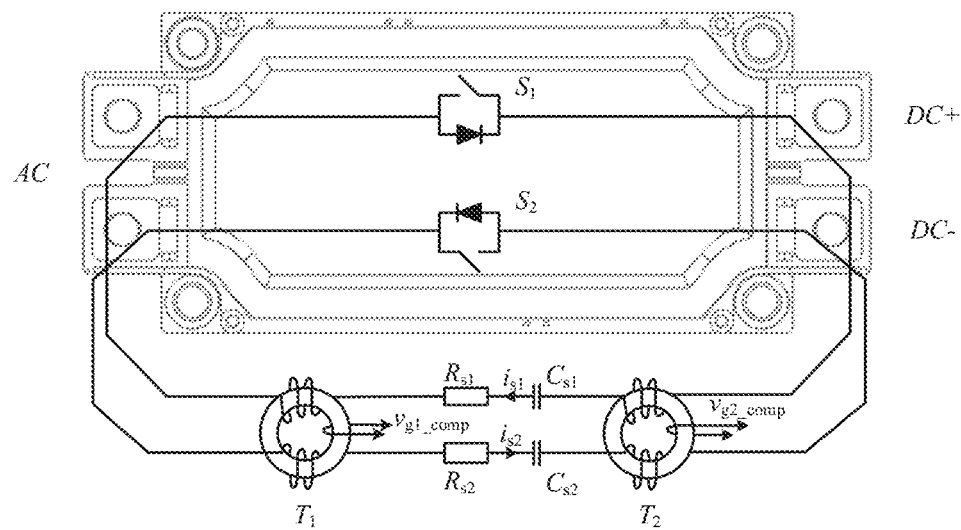
FIG. 5 is a layout chart showing a snubber capacitor for reducing parasitic capacitance according to an embodiment of the present disclosure.

For a device with two transistors connected in series, coupling inductance may exist between an upper-transistor snubber circuit loop and a lower-transistor snubber circuit loop. In an embodiment, the snubber circuit is arranged on a side of the power module, the snubber circuit of the first SiC MOSFET and the snubber circuit of the second SiC MOSFET are in an overlapped layout, and thus a loop coupling coefficient is relatively large. Meanwhile, because the currents of the snubber capacitors in the two snubber circuits are opposite in direction, this coupling inductance has an offset effect on the coupling inductance of the original loop. If the coupling coefficient of this coupling inductance is 1, the leakage inductance of the snubber circuit does not work at all. Therefore, in practical applications, the layout as shown in FIG. 5 may be used, and the coupling coefficients of the snubber circuits with two transistors connected in series are increased as much as possible.

To illustrate the effectiveness of the present disclosure, two ROHM's high-power SiC MOSFET devices (rated voltage 1200V, rated current 180A, model BSM180D12P2E002) connected in series are taken as an example to perform experimental verification on the circuit voltage equalization method of the present disclosure. In this embodiment, resistors of 5Ω are selected as the snubber resistors $R_{s1}$ and $R_{s2}$ of the RC snubber circuits, and capacitors of 4.7 nF are selected as the snubber capacitors $C_{s1}$ and $C_{s2}$. resistors of 1.55Ω are selected as the drive resistors $R_{g11}$ and $R_{g21}$ of the gate drive circuits, and resistors of 1Ω are selected as the drive resistors $R_{g12}$ and $R_{g22}$. The drive voltage sources $V_{g1}$ and $V_{g2}$ are uniformly controlled by a global control circuit.

Figure 6:
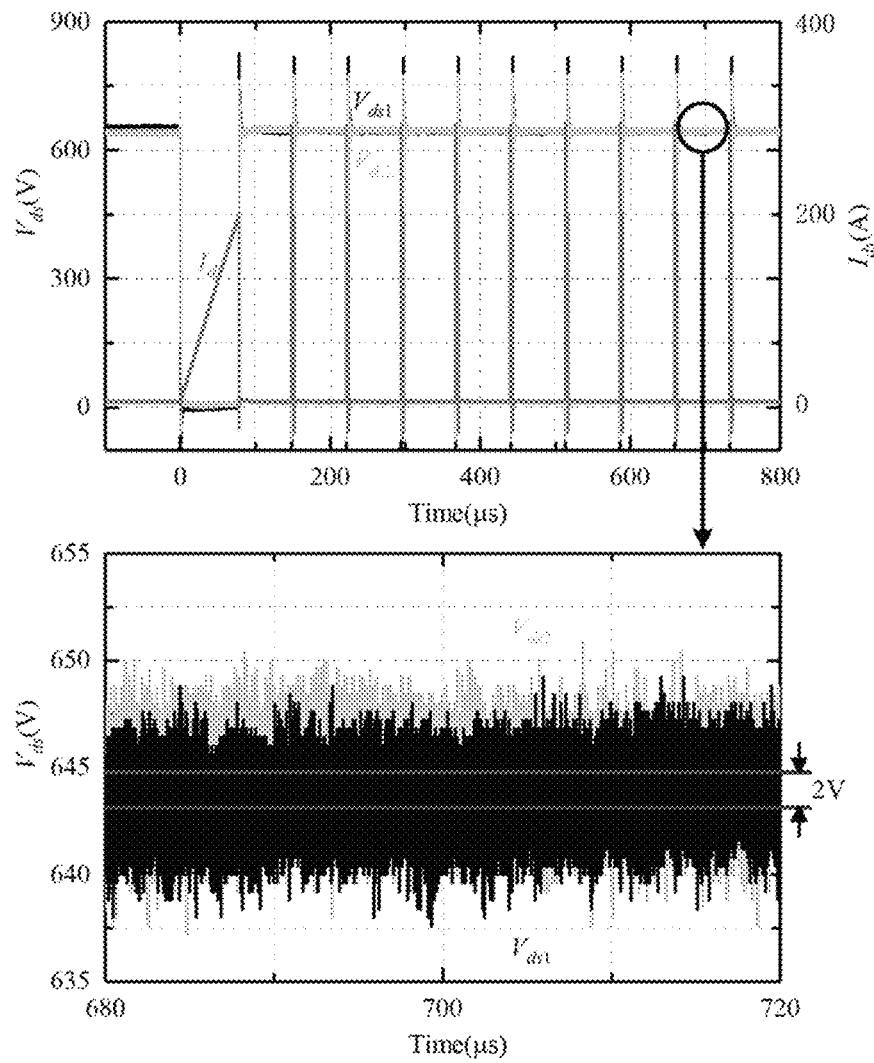
FIG. 6 is a diagram showing dynamic voltage equalization experiment verification results of series operation of two SiC MOSFETs according to an embodiment of the present disclosure.

In an embodiment, when a bus voltage is 1300V and a load current is 200 A, series voltage test results are shown in FIG. 6. The abscissa in FIG. 6 represents time, the ordinate represents an magnitude of voltage or current, and the lower part of FIG. 6 is an enlarged schematic diagram of the circled portion in the upper part. The voltages corresponding to two switch transistors $S_1$ and $S_2$ are $V_{ds1}$ and $V_{ds2}$, respectively. In order to more intuitively reflect that the technical solutions of the present disclosure can ensure voltage equalization of the power switch transistors connected in series, voltage waves measured by the two switch transistors are stacked together, and waveforms of the current $I_{ds}$ are also superimposed. After testing, it is found that the voltage differential between the two SIC MOSFET devices connected in series is only about 2 V, and the voltage equalization is still maintained after 10 switching cycles. That is, the voltage equalization has better stability. When the solution of this embodiment is not used, under the same test conditions, the voltage differential between the two series-connected SiC MOSFET devices is about 100V. In this way, it verifies the correctness and reliability of the gate voltage magnitude compensation equalization method for series operation of power switch transistors in the present disclosure.

In this embodiment, in the turn-off process of the SiC MOSFET devices, when a drain-source voltage $V_{ds1}$ of the first SIC MOSFET ($MOS_1$) is greater than a drain-source voltage $V_{ds2}$ of the second SIC MOSFET ($MOS_2$), a current $i_{s1}$ of the snubber circuit is also greater than a current $i_{s2}$ of the snubber circuit, and the current differential therebetween is compensated to gate drive signals of the two SiC MOSFETs through the coupling transformers, such that the magnitude of the drive signal of the first SiC MOSFET ($MOS_1$) is slightly reduced, whereas the magnitude of the drive signal of the second SiC MOSFET ($MOS_2$) slightly rises, and correspondingly a voltage rise rate of the first SiC MOSFET ($MOS_1$) is slightly reduced, and the voltage rise rate of the second SiC MOSFET ($MOS_2$) is slightly increased. In this way, the dynamic voltage equalization is implemented.

The above description of the embodiments is to facilitate those of ordinary skill in the art to understand and apply the present disclosure. Obviously, those skilled in the art can easily make various modifications to the above-mentioned embodiments, and apply the general principles described here to other embodiments without creative labor. Therefore, the present disclosure is not limited to the above-mentioned embodiments. Based on the disclosure of the present disclosure, all improvements and modifications made by those skilled in the art to the present disclosure should fall within the protection scope of the present disclosure.

What is claimed is:

1. A gate voltage magnitude compensation equalization circuit for series operation of power switch transistors, comprising:

N power switch transistors, N sampling units, N gate voltage magnitude compensation units, and N gate drive circuits in series operation, wherein N is a natural number greater than or equal to two, each of the N power switch transistors is connected in parallel with a resistor-capacitor snubber circuit, and the each of the N power switch transistors corresponds to a corresponding sampling unit of the N sampling units, a corresponding gate voltage magnitude compensation unit of the N gate voltage magnitude compensation units, and a corresponding gate drive circuit of the N gate drive circuits;

each of the N sampling units samples current values of the resistor-capacitor snubber circuits;

each of the N gate voltage magnitude compensation units is connected to the corresponding sampling unit and obtains a sampling signal outputted by the corresponding sampling unit to obtain a current signal in direct proportion to a variation rate of an unbalanced voltage differential of a corresponding power switch transistor of the N power switch transistors, and outputs the current signal to the corresponding gate drive circuit; and each of the N gate drive circuits adds a compensation voltage into a gate voltage of the corresponding power switch transistor, and outputs a voltage obtained by adding the compensation voltage into the gate voltage to the corresponding power switch transistor.

2. The gate voltage magnitude compensation equalization circuit according to claim 1, wherein the each of the N gate drive circuits comprises a drive voltage source and two gate drive resistors connected in series, two ends of either one of the two gate drive resistors are connected in parallel with the current signal introduced by the corresponding gate voltage magnitude compensation unit, and a drive compensation voltage in direct proportion to the variation rate of the unbalanced voltage differential is added into the gate voltage of the corresponding power switch transistor.

3. The gate voltage magnitude compensation equalization circuit according to claim 1, wherein the each of the N sampling units comprises N sampling inductors wound round a same magnetic ring, and a first sampling inductor of the N sampling inductors samples the current value of the resistor-capacitor snubber circuit connected in parallel with the corresponding power switch transistor, and remaining sampling inductors of the N sampling inductors sample the current values of the resistor-capacitor snubber circuits connected in parallel with remaining power switch transistors, respectively, the first sampling inductor is opposite to the remaining sampling inductors in a coil winding direction, and a number of turns of the first sampling inductor is N−1 times a number of turns of the remaining sampling inductors.

4. The gate voltage magnitude compensation equalization circuit according to claim 3, wherein the each of the N gate voltage magnitude compensation units comprises a drive voltage compensation inductor wound round the same magnetic ring, a coil winding direction of the drive voltage compensation inductor is identical to a coil winding direction of the first sampling inductor, the drive voltage compensation inductor, the first sampling inductor and the remaining sampling inductors are wound round the same magnetic ring to form a coupling transformer, and the drive voltage compensation inductor is connected in parallel to two ends of a gate drive resistor of the corresponding gate drive circuit.

5. The gate voltage magnitude compensation equalization circuit according to claim 1, wherein the N power switch transistors adopt insulation gate bipolar transistor (IGBT) modules, and an emitter of a $(k-1)^{th}$ IGBT is connected to a collector of a $k^{th}$ IGBT, wherein k is a natural number and $2 \leq k \leq N$.

6. The gate voltage magnitude compensation equalization circuit according to claim 1, wherein the N power switch transistors adopt metal-oxide-semiconductor field-effect transistor (MOSFET) modules, and a source of a $(k-1)^{th}$ MOSFET is connected to a drain of a $k^{th}$ MOSFET, wherein k is a natural number and $2 \leq k \leq N$.

7. The gate voltage magnitude compensation equalization circuit according to claim 1, wherein every two adjacent resistor-capacitor snubber circuits are in an overlapped layout, and electric currents flowing through snubber capacitors of the two adjacent resistor-capacitor snubber circuits are opposite in direction.

* * * * *